(12) United States Patent
Tatsumi et al.

(10) Patent No.: US 8,427,168 B2
(45) Date of Patent: Apr. 23, 2013

(54) PLASMA MONITORING METHOD

(75) Inventors: Tomohiko Tatsumi, Miyagi (JP); Seiji Samukawa, Miyagi (JP)

(73) Assignee: Oki Semiconductor Co., Ltd., Tokyo (JP)

(*) Notice: Subject to any disclaimer, the term of this patent is extended or adjusted under 35 U.S.C. 154(b) by 479 days.

(21) Appl. No.: 12/725,815

(22) Filed: Mar. 17, 2010

(65) Prior Publication Data

US 2010/0244861 A1 Sep. 30, 2010

(30) Foreign Application Priority Data

Mar. 26, 2009 (JP) ................................. 2009-077150

(51) Int. Cl.
*G01N 27/62* (2006.01)
(52) U.S. Cl.
USPC .......................................................... 324/464
(58) Field of Classification Search .................. None
See application file for complete search history.

(56) References Cited

U.S. PATENT DOCUMENTS

| | | | |
|---|---|---|---|
| 5,939,886 A * | 8/1999 | Turner et al. | 324/464 |
| 7,184,134 B2 * | 2/2007 | Samukawa | 356/72 |
| 2005/0115673 A1 * | 6/2005 | Samukawa et al. | 156/345.28 |
| 2005/0185171 A1 * | 8/2005 | Samukawa | 356/237.1 |
| 2005/0263247 A1 * | 12/2005 | Samukawa et al. | 156/345.24 |
| 2009/0058424 A1 * | 3/2009 | Tatsumi et al. | 324/464 |
| 2009/0058432 A1 * | 3/2009 | Hashimoto et al. | 324/693 |
| 2009/0061540 A1 * | 3/2009 | Tatsumi | 438/9 |
| 2010/0148769 A1 * | 6/2010 | Choi et al. | 324/239 |
| 2010/0176085 A1 * | 7/2010 | Mizukami et al. | 216/61 |

FOREIGN PATENT DOCUMENTS

| | | |
|---|---|---|
| JP | 2003-282546 | 10/2003 |
| JP | 2005-236199 | 9/2005 |

\* cited by examiner

*Primary Examiner* — Jermele M Hollington
(74) *Attorney, Agent, or Firm* — Volentine & Whitt, PLLC

(57) ABSTRACT

A plasma monitoring method measures in-situ a resistance of and a current flowing in a side wall. A monitoring system has two sensors in a plasma chamber, each having upper and lower electrodes. An external resistance element is connected only to one of the two sensors, in parallel to the wires extending from the upper and lower electrodes of the sensor concerned. Consequently, a resistance between the upper and lower electrodes is different in the two sensors, and two different values of potential difference between the upper and lower electrodes are obtained in-situ. Because a resistance value of the external resistance element is known, a resistance value of a side wall of a contact hole per one contact hole is obtained in-situ, and consequently an electric current flowing in the side wall of the contact hole per one contact hole can be obtained.

13 Claims, 7 Drawing Sheets

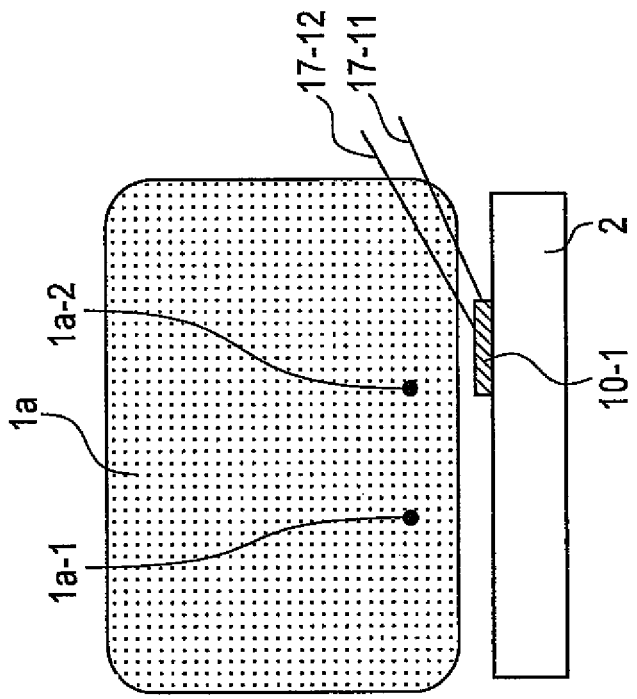
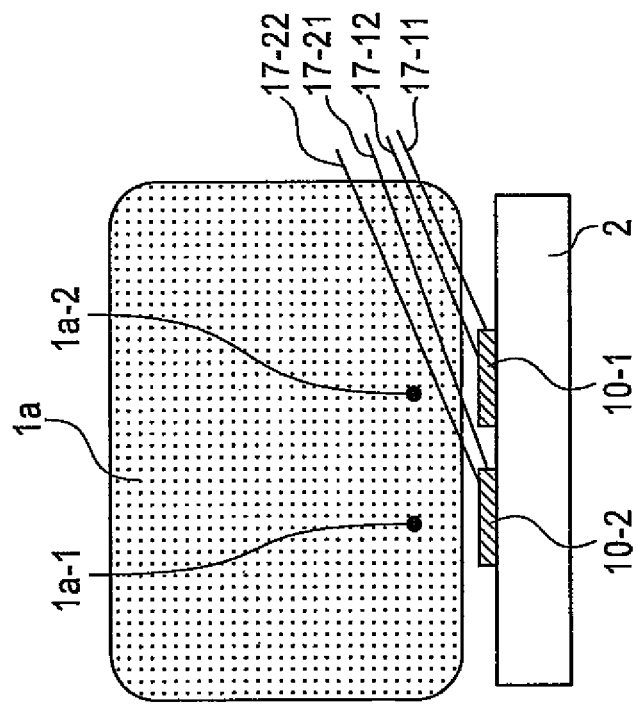

PLASMA MONITORING METHOD

BACKGROUND OF THE INVENTION

1. Field of the Invention

The present invention generally relates to a plasma monitoring method that can be applied to a semiconductor production process and other production processes using plasma, and more particularly to a plasma monitoring method for measuring in-situ a resistance of a side wall of a pattern such as a contact hole side wall and a current flowing in the side wall.

2. Description of the Related Art

Plasma monitoring methods for monitoring a wafer that is processed in a plasma apparatus are described for example in Japanese Patent Application Kokai (Laid-Open) No. 2003-282546 and Japanese Patent Application Kokai No. 2005-236199.

Japanese Patent Application Kokai No. 2003-282546 and No. 2005-236199 point out that serious problems such as shape abnormality and/or etching stop caused by an electron blocking (or electron shielding) effect in a plasma process (e.g., dry etching) are encountered as the circuit pattern of a semiconductor device is miniaturized.

The electron blocking effect is described briefly. Electrons (negative electric charge) and positive ions fall on a wafer surface from plasma when plasma treatment is conducted on the wafer placed on a stage inside a plasma chamber. The positive ions fall on the wafer surface almost perpendicularly, but the electrons do not fall perpendicularly. As a result, the positive ions reach a deep bottom of contact holes formed in the wafer and are accumulated therein, whereas the electrons collide with the inner walls (side walls) of contact holes and do not reach the contact hole bottom. The difficulty of the electrons reaching the contact hole bottom due to the incident angle of the electrons is called the electron blocking (or electron shielding) effect. The electron blocking effect creates a difference in the amount of electric charge between the wafer surface and the contact hole bottom, and a difference in electric potential between the contact hole top (upper end) and the contact hole bottom. Accordingly, the etching stop and/or shape abnormality can occur.

In order to resolve these problems, a method has been suggested and studied by which plasma process conditions are decided such that a deposition film with a comparatively low resistance is formed on the side wall of a contact hole and the electrons accumulated on or near the upper end of the contact hole move down along the side wall and cancel the positive electric charge at the contact hole bottom. This will relax the electron blocking effect.

The deposition film is an etching reaction product that is provided on the side wall of the contact hole as a result of chemical reaction between the film to be etched and radicals emitted from plasma during contact etching. The formation of such deposition film on the contact hole side wall is well known in the art. The resistance rate of the deposition film has been reported to change depending on the plasma process conditions (for example, type of gas and applied power) during contact hole etching.

Various researches have been conducted by way of simulation of contact hole etching or the like to reproduce complex phenomena taking place on the side wall of contact hole. For the results calculated by simulation to match the results obtained in the actual etching process, it is desirable that various parameters included in the simulation (e.g., plasma temperature, plasma density, pressure inside the plasma chamber, potential inside the contact hole, and electric current flowing in the side wall of the contact hole) be close to actual values, and the actually measured values be used for such parameters.

For example, the inventors of the present application have disclosed in Japanese Patent Application Kokai 2009-59880 published on Mar. 19, 2009 (Patent Application No. 2007-225677 filed on Aug. 31, 2007) a method for measuring in-situ an electric potential inside a contact hole. The measured electric potential is used as one of the above-mentioned parameters for the simulation. However, a resistance or electric current value of the side wall of the contact hole cannot be measured in-situ by this method.

SUMMARY OF THE INVENTION

The following problems are associated with the conventional plasma monitoring methods.

When a relationship between a resistance of the side wall of a contact hole and plasma process conditions suited for formation of a low-resistance deposition film is evaluated in the research aimed at the relaxation of the electron blocking effect, no method is available for measuring in-situ the resistance of the contact hole side wall. Thus, a sample is taken out of the plasma chamber after the plasma process is completed. Then, a probe is brought into contact with the sample in the atmosphere, a voltage is applied between the top and bottom of the contact hole, and the side wall resistance is measured. Under these circumstances, even if the plasma process conditions that provide a low side wall resistance for relaxation of the electron blocking effect are obtained, there is a possibility that a low resistance will not be provided in reality in the plasma chamber (during the plasma discharging) because of the difference in elements/factors affecting the side wall resistance of the contact hole (such as moisture content, temperature, and vacuum UV radiation) between the plasma inside the plasma chamber and the atmosphere outside the plasma chamber. In other words, the resistance may be high in-situ (in the plasma chamber during the plasma processing) although the resistance is low in the atmosphere. In this case, the relaxation of the electron blocking effect cannot be expected.

The vacuum UV radiation is explained below. Vacuum UV radiation is emitted, in addition to electrons and positive ions, from plasma. The vacuum UV radiation has a wavelength of equal to or lower than 190 nm (energy equal to or higher than 6.5 eV) and propagates in vacuum, but does not propagate in the atmosphere because this radiation is absorbed and extinguished by oxygen molecules and the like.

A problem associated with simulation such as contact hole etching simulation is that there are no actually measured values of in-situ electric current flowing in the contact hole side wall or in-situ electric resistance of the contact hole side wall. The accuracy of simulation cannot be increased without using these actually measured values in the simulation. Another problem is that even if the in-situ electric current flowing in the contact hole side wall or electric resistance of the contact hole side wall is found theoretically by simulation, there is no method for obtaining actually measured values for comparison required to determine whether the values obtained by simulation are correct.

According to a first aspect of the present invention, there is provided a plasma monitoring method that includes the step of preparing a sensor disposed in a plasma chamber. The sensor has two electrodes formed in a certain pattern. A resistance element is electrically connected between the two electrodes of the sensor. The plasma monitoring method also includes the step of measuring in-situ a resistance of a side wall of the pattern and/or an electric current flowing in the side wall of the pattern during the plasma processing (while the plasma is being generated), using the sensor and the resistance element. This method can accurately measure in-situ the resistance of the side wall of the pattern and the current flowing in the side wall of the pattern.

According to a second aspect of the present invention, there is provided another plasma monitoring method that includes the step of preparing a first sensor. Two first electrodes are formed in a first pattern in the first sensor. A resistance element is connected between first wires respectively extending from the first electrodes. The plasma monitoring method also includes the step of preparing a second sensor. Two second electrodes are formed in a second pattern in the second sensor. Second wires respectively extend from the second electrodes. The first and second sensors are located in a plasma chamber. The plasma monitoring method also includes the step of measuring in-situ a resistance of a side wall of the pattern and/or an electric current flowing in the side wall of the pattern, using the first and second sensors as well as the resistance element. Because the resistance element is connected to one of the two sensors provided in the plasma chamber, the resistances between the electrodes in the two sensors differ from each other and different differences in potential between the electrodes are obtained in-situ. Because the resistance value of the resistance element is already known, a resistance value per one side wall of the pattern can be obtained in-situ. After the resistance per one side wall of the pattern is obtained, a value of electric current flowing in the side wall of the pattern per one side wall of the pattern can be obtained.

According to a third aspect of the present invention, there is provided still another plasma monitoring method that includes the step of preparing a sensor disposed in a plasma chamber. Two electrodes are formed in a predetermined pattern in the sensor. A resistance element is electrically connected between the two electrodes of the sensor. The plasma monitoring method also includes the step of measuring in-situ a voltage in the pattern in the sensor using the sensor and the resistance element during plasma processing. The plasma monitoring method also includes the step of changing a resistance value of the resistance element. The plasma monitoring method also includes the step of measuring in-situ the voltage in the pattern in the sensor using the sensor and the resistance element having the changed resistance value. The resistance element is connected between the two electrodes of the sole sensor and a potential difference between the two electrodes is measured in-situ with respect to the two resistance values (one before the resistance value change, and one after the resistance value change). Therefore, a resistance value of the side wall of the pattern and a value of current flowing in the side wall can be obtained in-situ. The minimum number of channels of the voltmeter necessary to measure the electrode potential is two. Because the measurements are conducted with the single sensor, a resistance value of the side wall of the pattern positioned in the vicinity of a particular portion (local region) of plasma and a value of electric current flowing in the side wall can be measured with respect to that local region of plasma. Therefore, values that are affected by local plasma can be easily measured.

These and other objects, aspects and advantages of the present invention will become more apparent to those skilled in the art from the following detailed description when read and understood in conjunction with the appended claims and drawings.

BRIEF DESCRIPTION OF THE DRAWINGS

FIG. 7A is an illustration useful to explain advantages obtained in Embodiment 1; and FIG. 7B is an illustration useful to explain advantages obtained in Embodiment 2.

DETAILED DESCRIPTION OF THE INVENTION

Embodiments of the invention will be explained below with reference to the appended drawings. It should be noted that the drawings merely serve to illustrate the invention, and the scope of the invention is not limited thereby.

Embodiment 1

System Configuration

Figure 1:
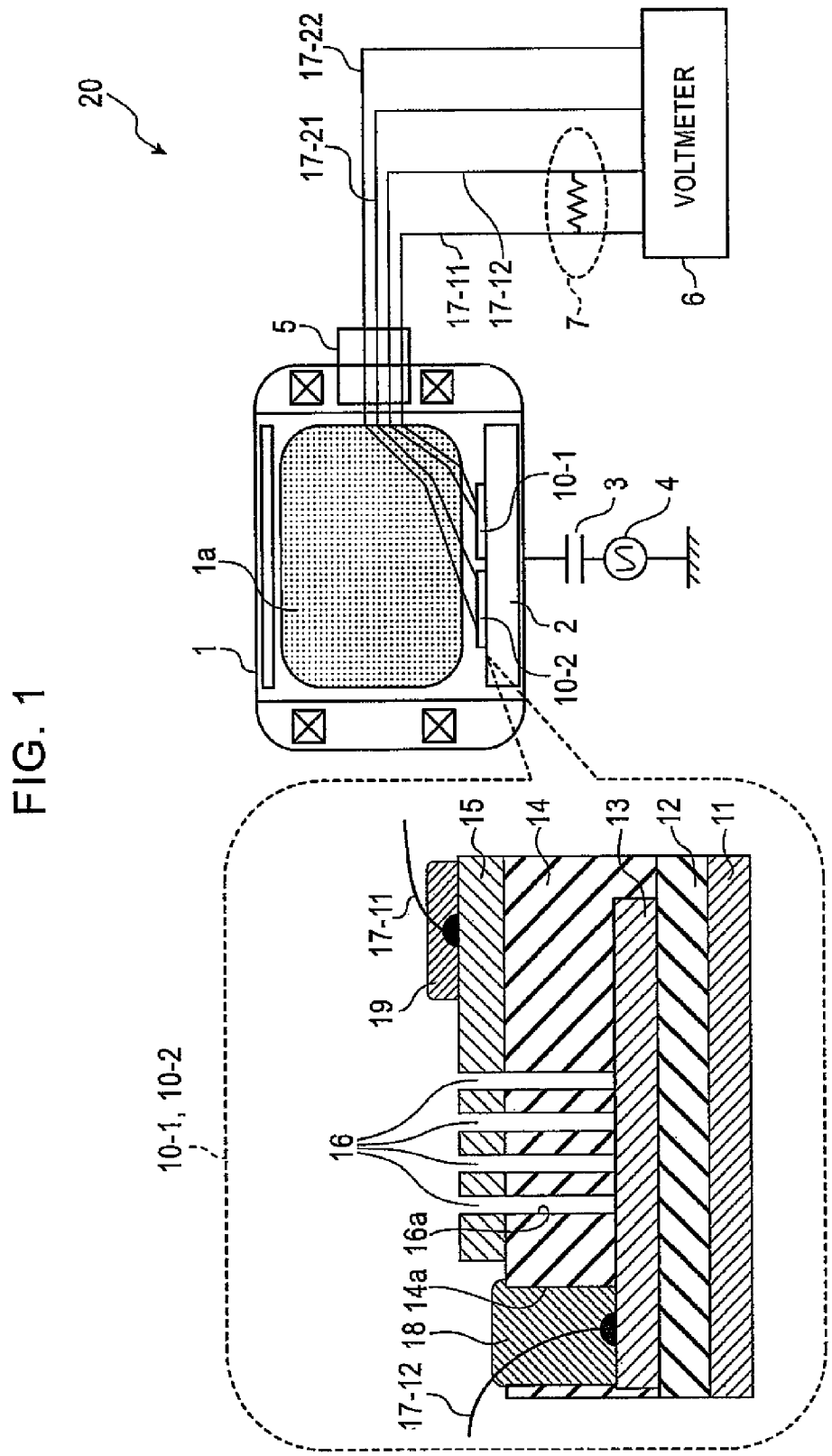
FIG. 1 is a schematic diagram illustrating a plasma monitoring system having two sensors according to Embodiment 1 of the present invention.

Referring to FIG. 1, a structure of a plasma monitoring system 20 of Embodiment 1 will be described.

The plasma monitoring system 20 has a plasma chamber 1. An electrically conductive stage 2 for supporting a treatment object such as a wafer is disposed in a location that is exposed to plasma 1a generated inside the plasma chamber 1. The stage 2 is connected to the ground GND, for example, via a capacitor 3 for DC prevention and a high-frequency (referred to hereinbelow as "RF") oscillator 4 for substrate bias. The plasma chamber 1 is also provided with a plasma generator (not shown in the drawing).

Two sensors 10-1, 10-2 of the same specifications that are used for monitoring are disposed on the stage 2. These two sensors 10-1 and 10-2 are referred to as first and second sensors.

The first sensor 10-1 has, for example, a silicon substrate 11. An insulating film 12 made from a silicon oxide film with a thickness of about 1.0 µm (micrometer) is formed on the silicon substrate 11. An electrically conductive lower electrode 13 made from polysilicon with a thickness of about 0.3 µm is formed on the insulating film 12. Another insulating film (or upper insulation film) 14 made from a silicon oxide film with a thickness of about 1.0 µm is formed on the lower electrode 13, and an electrically conductive upper electrode 15 made from polysilicon with a thickness of about 0.3 µm is formed on the upper insulation film 14. A plurality of contact holes 16 are formed in the upper insulating film 14 and upper electrode 15. The contact holes 16 are made by, for example, a dry etching device or other suitable device. Each contact hole 16 may have a diameter of 0.1 µm and a depth of 1.3 µm. The side wall of each contact hole 16 is designated by the reference numeral 16a.

A relatively wide groove 14a is formed in the upper insulation film 14 in addition to the narrow contact holes 16. The surface area of the groove 14a is about, for example, 40 mm². The lower electrode 13 is exposed by the groove 14a, and a conductive wire 17-12 that has an insulating coating thereon is connected to the bottom of the groove 14a (i.e., connected to the lower electrode 13) with a silver paste or the like. The groove 14a is then filled with a heat-resistant resin 18 to protect the wire 17-12 (particularly the lower end of the wire 17-12) from the plasma 1a. Another conductive wire 17-11 that has an insulating coating thereon is connected to the upper electrode 15 with a silver paste or the like at a location where the contact holes 16 are not formed. The lower end portion of the wire 17-12 is coated by a heat-resistant resin 19 to protect the wire 17-12 from the plasma 1a.

The second sensor 10-2 has a structure identical to that of the sensor 10-1. Two conductive wires 17-21, 17-22 are connected to the upper electrode 15 and lower electrode 13 of the second sensor 10-2, respectively.

The four wires 17-11, 17-12, 17-21, 17-22 of the two sensors 10-1, 10-2 extend out of the plasma chamber 1 via a hermetic seal 5 provided at the plasma chamber wall. The four extending portions of the wires 17-11, 17-12, 17-21, 17-22 are connected to four channels of a voltmeter 6 respectively. The upper electrodes 15 and lower electrodes 13 of the sensors 10-1, 10-2 are electrically connected to the channels of the voltmeter 6 by the wires 17-11, 17-12, 17-21, 17-22, and the hermetic seal 5 is a terminal for electrically linking the wires located inside the plasma chamber 1 and the wires located outside the plasma chamber 1.

An electric current that flows in the wires 17-11, 17-12, 17-21, 17-22 while plasma is being generated is an alternating current that is a composite wave of an alternating current component whose electric potential changes periodically and a direct current component whose electric potential does not change. The potential that is wished to be measured is the direct current component. In order to remove or inhibit (or suppress) the alternating current component, the wires 17-11, 17-12, 17-21, 17-22 may be connected to the voltmeter 6 via a low-pass filter or a choke coil.

An external resistance element 7 with a resistance of 10 MΩ (megaohm) is connected between the two wires 17-11, 17-12 that extend out of the plasma chamber 1 from one sensor (for example, the sensor 10-1) among the two sensors disposed in the chamber 1. When two sensors 10-1, 10-2 are disposed inside the plasma chamber 1, a total of four wires 17-11, 17-12, 17-21, 17-22 extend out of the plasma chamber 1, but the external resistance element 7 is connected only between the two wires 17-1, 17-2 that are connected to one sensor (sensor 10-1 in the illustrated embodiment) from among the four wires.

Plasma Monitoring Method

Figure 2:
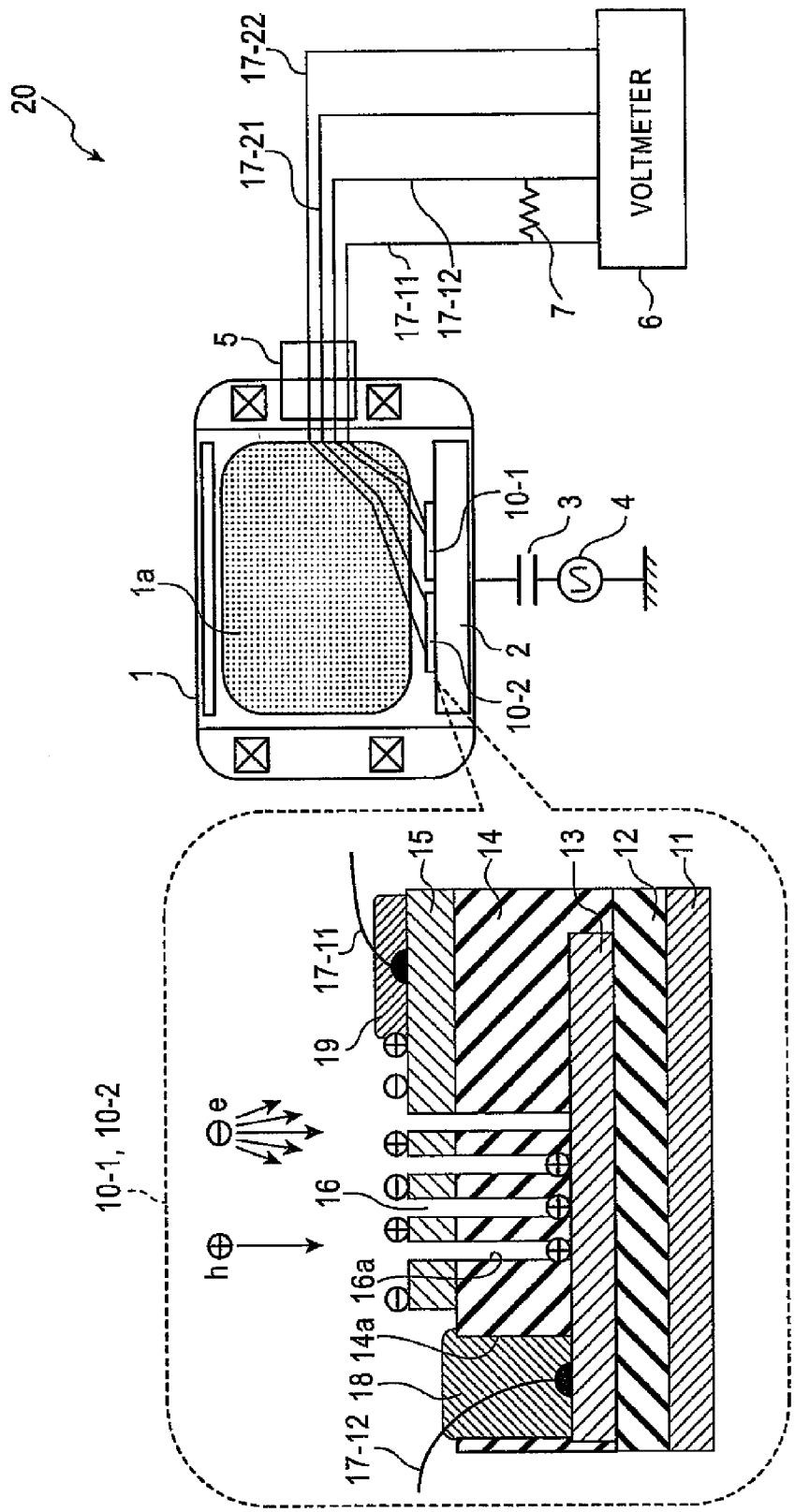
FIG. 2 illustrates the plasma monitoring method used in the system shown in FIG. 1.
Figure 3A:
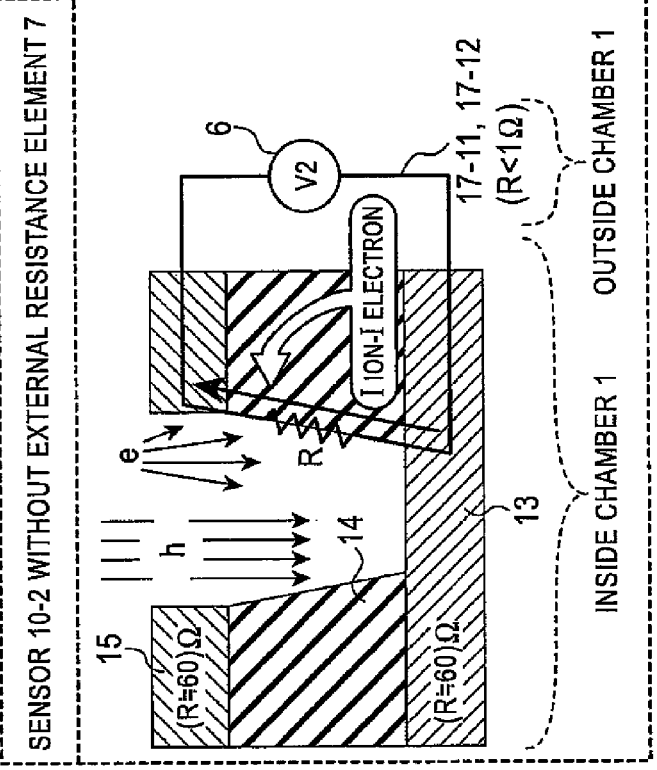
FIG. 3A is an equivalent circuit diagram of the plasma monitoring system in connection with one sensor shown in FIG. 1.
Figure 3B:
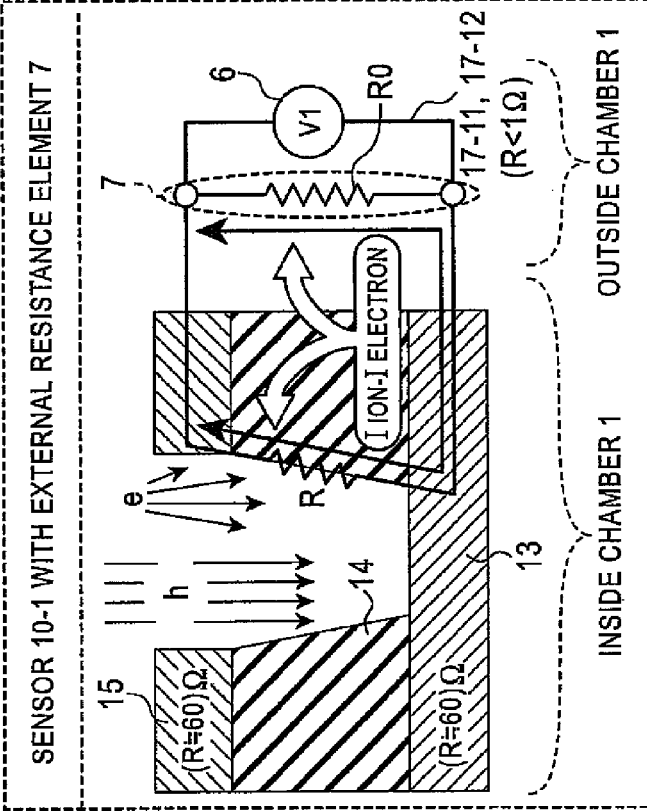
FIG. 3B is an equivalent circuit diagram of the plasma monitoring system in connection with another sensor shown in FIG. 1.

Referring to FIG. 2, FIG. 3A and FIG. 3B, the plasma monitoring method for the system 20 shown in FIG. 1 will be described. FIG. 3A is an equivalent circuit diagram for the first sensor 10-1 and FIG. 3B is an equivalent circuit diagram for the second sensor 10-2.

The plasma monitoring method uses the two sensors 10-1, 10-2 located in the plasma chamber 1.

For example, a pressure inside the plasma chamber 1 is set to 120 mTorr, and a mixed gas of CHF3, CF4, N2 and Ar is confined in the plasma chamber 1 as a sealed (or filled-in) gas. An RF bias of 1600 W is applied to the plasma chamber 1, and the plasma 1a is generated inside the plasma chamber 1.

As a result, positive ions h and electrons e fall from the plasma 1a on the upper electrode 15, which is an uppermost layer in each sensor 10-1, 1-02, and on the lower electrode 13 through the insulating film 14. However, because of the difference in the incidence angles of the positive ions h and electrons e, the electrons e hardly arrive at the bottom of the contact holes 16 (electron blocking effect). Thus, an amount of electrons accumulated on the lower electrode 13 of the sensor 10-1, 10-2 at the bottom of the contact holes 16 is less than an amount of electrons accumulated on the upper electrode 15 of the sensor 10-1, 10-2. Accordingly, the electric potential of the lower electrode 13 becomes higher than that of the upper electrode 15, and a difference in potential is generated.

The side walls 16a of the contact holes 16 have a high resistance, but are not given perfect insulation. Therefore, the electrons e (negative eclectic charges) on the upper electrode 15 move (descend) along the side walls 16a of the contact holes 16 to the lower electrode 13. Accordingly, the lower electrode 13 obtains additional electric potential. The difference V in potential that is generated between the upper electrode 15 and lower electrode 13 can be represented by Equation (1).

An electric current I (I=Iion−Ielectron; Iion is a current produced by electrons e, Ielectron is a current produced by positive ions h) shown in FIG. 3 has a positive electric charge and an electric charge thereof is opposite to that of electrons e. As a result, the propagation direction of the current I is shown in the figure in the direction opposite to the propagation direction of electrons e.

$$V = I * R \quad (1)$$

In Equation (1), I is a sum of the electric currents flowing in the side walls 16a of the contact holes 16, and R is a sum of the side wall resistances of the contact holes 16.

The side wall resistance of a contact hole is a degree showing how difficult it is for the electric current to flow in the side wall path of the contact hole; the easier it is for the current to flow, the smaller is this resistance value. Therefore, as the number of contact holes 16 formed between the upper electrode 15 and lower electrode 13 increases, the number of current paths in the side walls 16a of the contact holes increases, the current can flow easier, and the total resistance R decreases. In this specification, the side wall resistance per one contact hole is represented by Rh. When a plurality of contact holes 16 are formed between the upper electrode 15 and lower electrode 13, it can be assumed, according to the circuit theory, that a plurality of resistances Rh are connected in parallel. Thus, the total resistance R (R=a sum of a plurality of resistances Rh in parallel connection) between the upper electrode 15 and lower electrode 13 can be represented by Equation (6).

$$Rh = R * (\text{number of contact holes formed in one sensor}) \quad (6)$$

The current I in Equation (1) is a difference between the amount of electrons falling on the upper electrode 15 at the sensor surface and the amount of electrons falling on the lower electrode 13 at the contact hole bottom. This difference is caused by the incidence angle of the electrons e. In other words, the electrons e that fell on the upper electrode 15 at the sensor surface move on the side walls 16a of the contact holes 16 to the lower electrode 13 at the contact hole bottom because the lower electrode 13 is reached by fewer electrons e from the plasma 1a. This current I is represented by I=Iion−Ielectron in FIG. 3. Because the side walls 16a of the contact holes have the resistance R, a difference V in potential is generated between the upper electrode 15 and lower electrode 13, as shown by Equation (1). The current I practically does not depend on the resistance R.

It should be assumed here that the difference in potential generated between the upper electrode 15 and lower electrode 13 of the first sensor 10-1 connected to the external resistance element 7 is denoted by V1 and the difference in potential generated between the upper electrode 15 and lower electrode 13 of the second sensor 10-2 that is not connected to the external resistance element 7 is denoted by V2. Because the potential difference V1, V2 is proportional to the resistance R between the upper electrode 15 and lower electrode 13, the relationship between the potential differences V1 and V2 that are measured by the voltmeter 6 is given Equation (2) if Equation (1) is used.

$$V1<V2 \tag{2}$$

Thus, when a current flows between the upper electrode 15 and lower electrode 13 of the sensor 10-1 connected to the external resistance element 7, the current flows not only in the side walls 16a of the contact holes 16, but also in the external resistance element 7 and two wires 17-11, 17-12 connected to the upper electrode 15 and lower electrode 13. Therefore, the current flows easier than in the case in which the current path is only in the side walls 16a of the contact holes 16. The external resistance element 7 connected between the wires 17-11 and 17-12 is located outside the plasma chamber 1, rather than inside the plasma chamber 1 where the sensors 10-1, 10-2 are disposed, but it should be understood that in terms of electric circuitry the location of the resistance element 7 (whether inside or outside the chamber 1) does not matter. When the external resistance element 7 is connected between the wires 17-11 and 17-12, the electrons e of the upper electrode 15 flow through the two current paths, i.e., they flow in the side walls 16a of the contact holes 16 from the upper electrode 15 and reach the lower electrode 13, and flow out of the plasma chamber 1 via the wire 17-11 from the upper electrode 15, pass through the external resistance element 7 located outside the chamber 1, enter again the chamber 1 via the wire 17-12 connected to the lower electrode 13, and reach the lower electrode 13. Thus, the differences in potential satisfy the relationship represented by Equation (2).

Based on the circuit theory, Equation (3) is established for the sensor 10-1 connected to the external resistance element 7.

$$V1=R*R0*I/(R+R0) \tag{3}$$

R0 is a resistance of the external resistance element 7, which is a known value. Based on the circuit theory, Equation (4) is valid for the sensor 10-2 that is not connected to the external resistance element 7.

$$V2=R*I \tag{4}$$

Therefore, Equation (5) can be derived from Equations (3) and (4).

$$R=(V2/V1-1)*R0 \tag{5}$$

In Equation (5), the resistance value R0 of the external resistance element 7 is a known value, and the potential differences V1 and V2 are values that are measured with the voltmeter 6. By substituting (assigning) the resistance value R0 and the potential differences V1, V2 in Equation (5), the resistance between the upper electrode 15 and lower electrode 13, that is, the resistance R of the side walls of the contact holes 16 is obtained. Then, the current I flowing in the side walls 16a of contact holes 16 is obtained by substituting the potential difference V2 and the side wall resistance R into Equation (1).

Therefore, the relationship between the total side wall resistances R of the contact holes 16 and the side wall resistance per unit contact hole Rh is expressed by Equation (6), and the relationship between the total currents I flowing in the contact hole side walls 16a and a current flowing in the side wall 16a per unit contact hole Ih is expressed by Equation (7). Accordingly, the side wall resistance and current flowing in the side wall 16a per one contact hole can be obtained from Equations (6) and (7).

$$Rh=R*(\text{number of contact holes formed in one sensor}) \tag{6}$$

$$Ih=I/(\text{number of contact holes formed in one sensor}) \tag{7}$$

Advantages

The external resistance element 7 is connected only to one of the two sensors 10-1, 10-2 disposed inside the plasma chamber 1. Therefore, the resistance between the upper electrode 15 and lower electrode 13 of the first sensors 10-1 is different from that of the second sensor 10-2, and two values are in-situ obtained for the potential difference between the upper electrode 15 and lower electrode 13. Because the resistance value of the external resistance element 7 that is connected in parallel to the wires 17-11, 17-12 between the upper electrode 15 and lower electrode 13 of the first sensor 10-1 is known, a resistance value of the side wall 16a per one contact hole can be obtained in-situ from Equation (5) and (6).

After obtaining the resistance per one contact hole, it is possible to obtain the current flowing in the side wall 16a per one contact hole from Equations (4) and (7).

Embodiment 2

System Configuration

Figure 4:
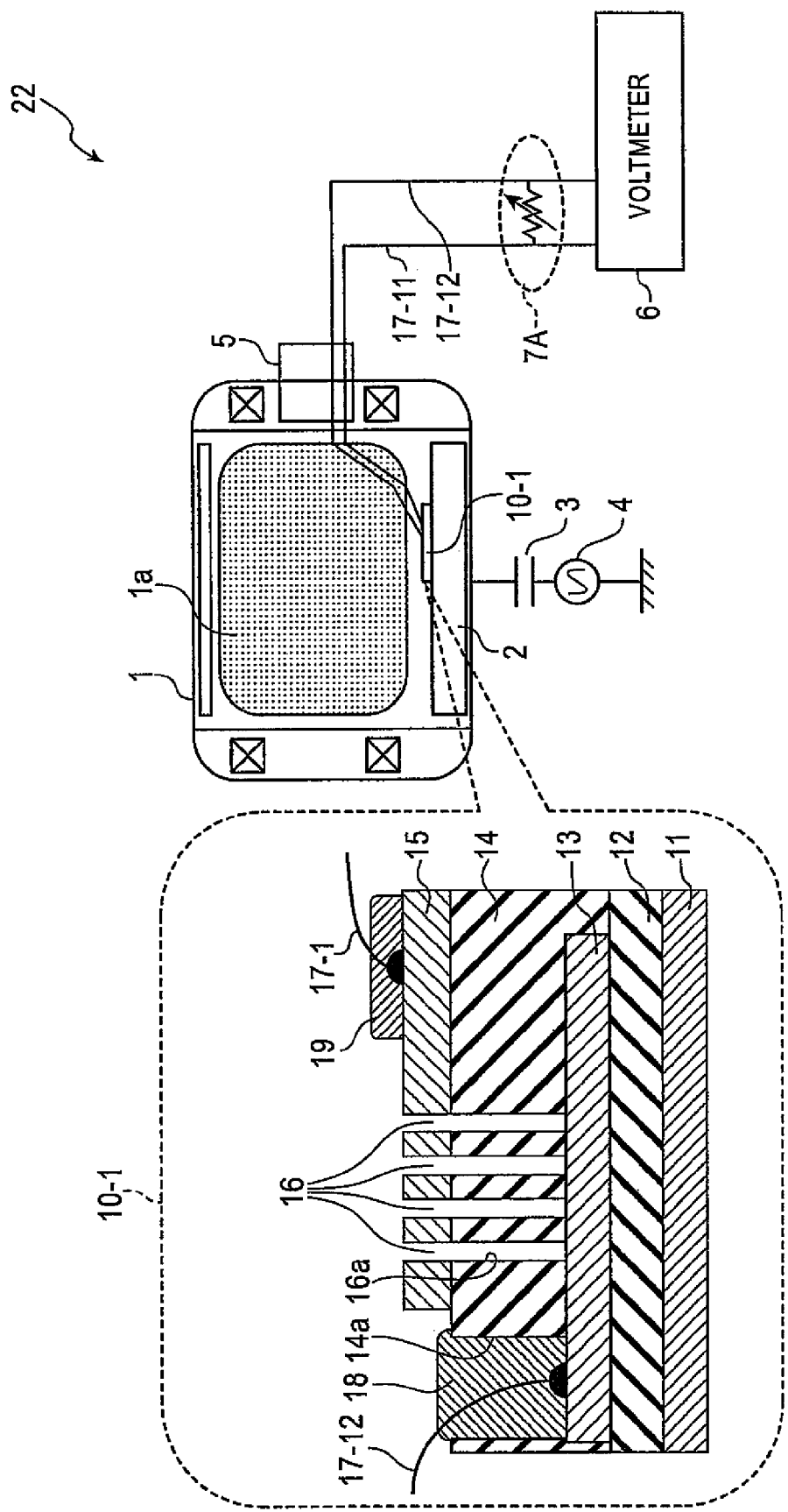
FIG. 4 is a schematic configuration diagram illustrating a plasma monitoring system of Embodiment 2 of the present invention.

Referring to FIG. 4, a plasma monitoring system 22 of Embodiment 2 will be described. Elements similar to or common with the elements shown in FIG. 1 that illustrates Embodiment 1 will be denoted by like reference numerals and symbols.

In the plasma monitoring system 22 of Embodiment 2, a single sensor 10-1 is provided on a stage 2, and two wires 17-1, 17-2 are connected to the sensor 10-1. The two wires 17-1 and 172 extend out of a plasma chamber 1 via a hermetic seal 5 and are connected to a voltmeter 6. A variable resistance element 7A is connected, instead of the fixed external resistance element 7 of Embodiment 1, between the two wires 17-11, 17-12 outside the plasma chamber 1. The resistance value of the variable resistance element 7A can be changed, for example, within a range of 10 MΩ (megaohm) to 100 MΩ. Other system configurations of the plasma monitoring system 22 of Embodiment 2 are identical to those of Embodiment 1 and redundant description is omitted.

Plasma Monitoring Method

Figure 5:
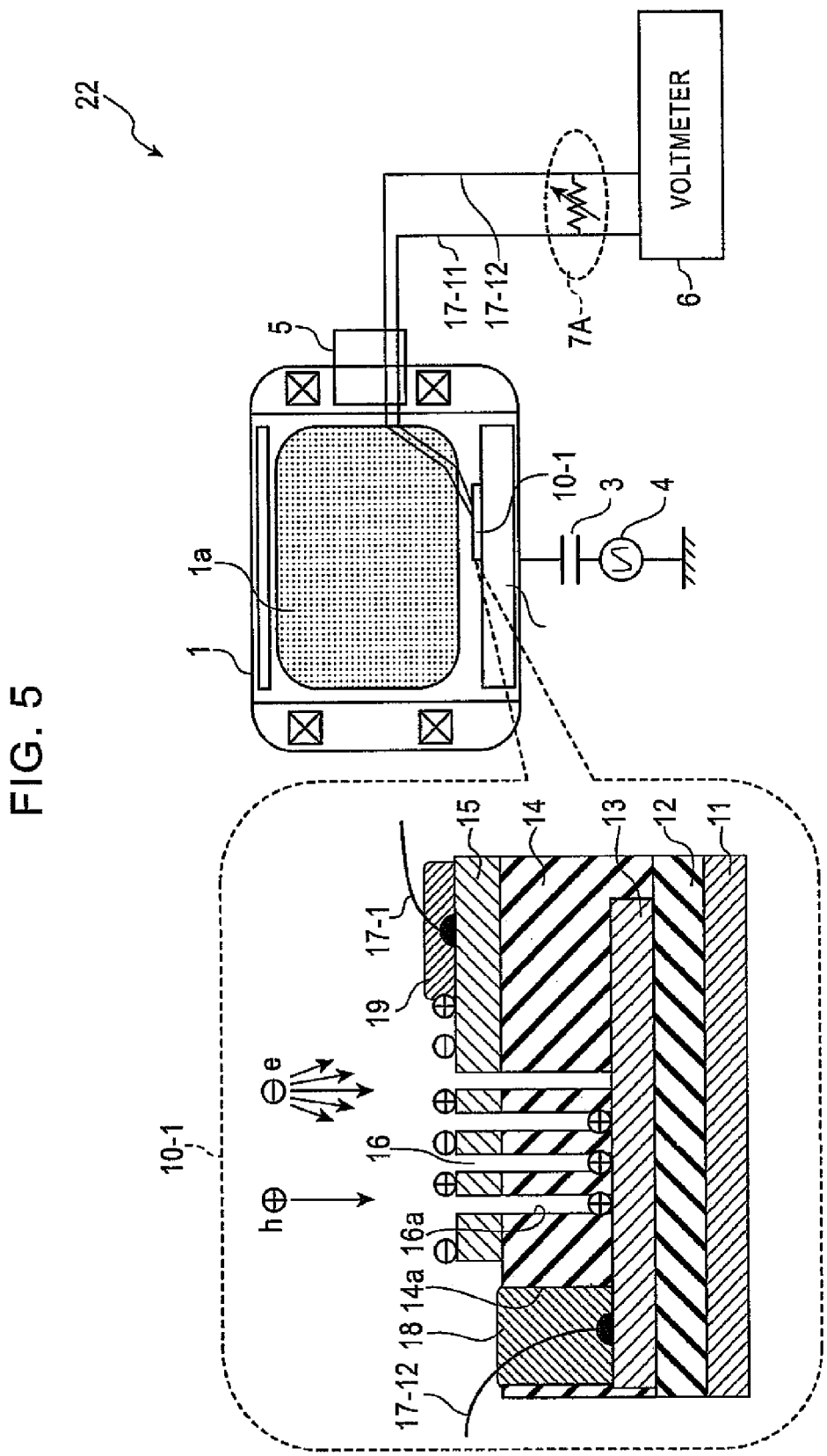
FIG. 5 illustrates the plasma monitoring method used for the system shown in FIG. 4.
Figure 6:
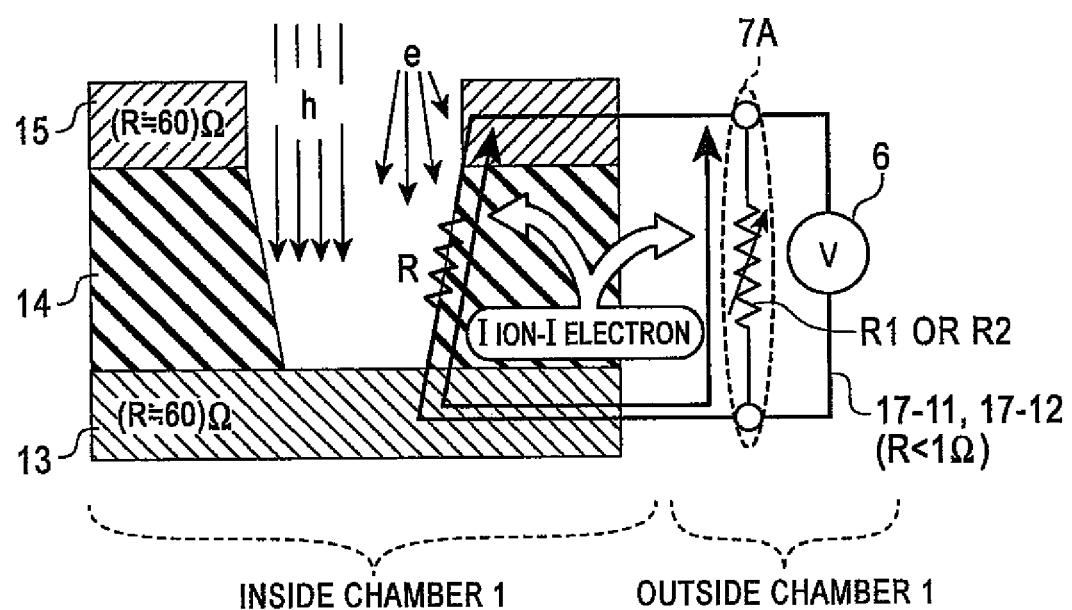
FIG. 6 is an equivalent circuit diagram of the configuration shown in FIG. 4.

Referring to FIGS. 5 and 6, the plasma monitoring method for the monitoring system 22 (FIG. 4) will be described. FIG. 6 is an equivalent circuit diagram of the configuration shown in FIG. 4. Elements common with the elements shown in FIGS. 2 and 3 that illustrate Embodiment 1 will be denoted by like reference numerals and symbols.

First, the sensor 10-1 is disposed on the stage 2 in the plasma chamber 1. The sensor 10-1 has an upper electrode 15 and a lower electrode 13. The resistance value of the variable resistance element 7A connected between the two wires 17-11, 17-12 outside the plasma chamber 1 is denoted by R1. Then, similar to Embodiment 1, an RF bias is applied to generate plasma 1a inside the plasma chamber 1. Positive ions h and electrons e fall from the plasma 1a onto the upper electrode 15 located on the sensor surface and onto the lower electrode 13 at the contact hole bottom. Due to the electron blocking effect, it is assumed that the amount of electrons e accumulated on the lower electrode 13 at the contact hole bottom is less than the amount of electrons a accumulated on the upper electrode 15 of the sensor 10-1.

As a result, the potential of the lower electrode 13 becomes higher than that of the upper electrode 15 and a difference in potential is generated. The side walls 16a of the contact holes 16 have a high resistance, but are not completely insulating. Thus, the electrons e of the upper electrode 15 propagate along the side walls 16a of the contact holes 16 and arrive at the lower electrode 13. At the same time, the electrons e of the upper electrode 15 move to the lower electrode 13 through the variable resistance element 7A and wires 17-11, 17-12 connected to the upper electrode 15 and lower electrode 13. In other words, the electrons e of the upper electrode 15 flow to the lower electrode 13 via two paths: one path defined by the contact hole side walls 16a and, another path defined by the variable resistance element 7A and wires 17-11 and 17-12.

In FIG. 6, currents flowing between the upper electrode 15 and lower electrode 13 via the two paths are collectively denoted by I (I=Iion−electron). It should be noted that because the current has a positive electric charge and an electric charge thereof is opposite to that of electrons e, the electrons e flow in the direction opposite to the propagation direction of current I. Thus, a difference in potential is generated between the upper electrode 15 and lower electrode 13. Here, the difference in potential measured by the voltmeter 6 located outside the plasma chamber 1 is denoted by V1, the parallel resistance (sum of the side wall resistances of the contact holes 16) for the total number of contact holes formed in the sensor 10-1 is denoted by R, and the resistance value of the variable resistance element 7A is denoted by R1. Then, the relationship between the current I, potential difference V1, and resistances R1, R can be represented by Equation (8) on the basis of circuit theory.

$$V1 = R*R1*I/(R+R1) \quad (8)$$

The resistance value of the variable resistance element 7A is changed (for example, changed by about 2 MΩ with respect to that at the time of initial setting) while the plasma 1a is being generated. The changed resistance value of the variable resistance element 7A is denoted by R2, and the difference in potential between the upper electrode 15 and lower electrode 13 measured after the resistance of the variable resistance element 7A has been changed is denoted by V2. Then, the relationship between the current I, potential difference V2, and resistances R2 and R can be represented by Equation (9) on the basis of circuit theory.

$$V2 = R*R2*I/(R+R2) \quad (9)$$

Therefore, Equation (10) can be derived from simultaneous Equations (8) and (9).

$$R = R1*R2*(V2-V1)/(R2*V1-R1*V2) \quad (10)$$

The side wall resistance value of all the contact holes 16 can be obtained by substituting the two resistance values R1 and R2 of the variable resistance element 7A into Equation (10) and also substituting the two differences V1 and V2 in potential between the upper electrode 15 and lower electrode 13 that have been measured with the voltmeter 6 before and after the resistance value of the variable resistance element 7A is changed into Equation (10). The sum total I of currents flowing in the side walls 16a of the contact holes 16 can be obtained by substituting the resistances R, R2 and the difference V1 in potential into Equation (8).

The relationship between the obtained side wall resistances R of all the contact holes 16 and the side wall resistance Rh per unit contact hole 16 can be represented by Equation (11), and the relationship between the total currents I and the current Ih flowing in the side wall 16a per unit contact hole 16 can be represented by Equation (12).

Therefore, the side wall resistance and current flowing in the side wall 16a per one contact hole 16 can be obtained using Equations (11) and (12).

$$Rh = R*(\text{number of contact holes formed in one sensor}) \quad (11)$$

$$Ih = I/(\text{number of contact holes formed in one sensor}) \quad (12)$$

Advantages

The advantages of Embodiment 2 will be explained in comparison with those of Embodiment 1 with reference to FIGS. 7A and 7B. FIG. 7A is used to describe the advantages obtained in Embodiment 1 and FIG. 7B is used to describe the advantages obtained in Embodiment 2.

As shown in FIG. 7A, Embodiment 1 requires at least four channels for the two sensors 10-1, 10-2 and one voltmeter 6 in order to measure the side wall resistances of the contact holes 16 and electric current flowing in the side walls 16a. Because the measurements are conduced with the two sensors 10-1 and 10-2 located inside the plasma chamber 1, the resistances of and currents flowing in the side walls of the contact holes 16 disposed in two different regions (for example, contact holes 16 affected by point 1a-1 and point 1a-2 in FIG. 7A) are measured with respect to the entire spatial distribution of the plasma 1a. The plasma 1a is not uniform inside the plasma chamber 1, and the side wall resistance of contact holes and the currents flowing in the side walls 16a vary under the influence of plasma state (density, temperature, etc.) in the vicinity of the contact holes concerned. Therefore, Embodiment 1 may not be the best system for measuring the resistance values of the side walls 16a of the contact holes 16 disposed in certain local regions of the plasma 1a and the values of currents flowing in these side walls 16a. For example, the values (resistance and current) affected by the local plasma at the point 1a-2 in FIG. 7A cannot be measured by the system of Embodiment 1.

Embodiment 2 has the variable resistance element 7A connected between the two wires 17-11 and 17-12 extending respectively from the upper electrode 15 and lower electrode 13 of the single sensor 10-1. The difference in potential between the two electrodes 15 and 13 is measured in-situ with respect to the two resistance values R1 and R2. As a result, the side wall resistance value of the contact holes 16 and the value of current flowing in the side walls 16a can be obtained in-situ by using Equations (8) to (12). Further, the minimum number of channels of the voltmeter 6 that is necessary to measure the electrode potential is two in Embodiment 2.

Because Embodiment 2 conducts the measurements with the sole sensor 10-1, the side wall resistance value of the contact holes 16 positioned in the vicinity of a local region (e.g., point 1a-2) of the plasma 1a and the value of current flowing in these side walls 16a can be measured for this local region. As shown in FIG. 7B, there is only one sensor 10-1 disposed, and therefore the resistance value and current value of the side walls 16a of the contact holes affected by the point 1a-2 can be measured with respect to the spatial distribution of the plasma 1a. In other words, Embodiment 2 is particularly useful when measuring the values affected by the local plasma.

Modifications

It should be noted that the present invention is not limited to the above-described Embodiments 1 and 2, and various changes and modifications can be made to the embodiments without departing from the spirit and scope of the present invention. For example, the following changes and modifications (a) to (d) are possible.

(a) The measuring method of Embodiment 2 uses the variable resistance element 7A, but it is also possible to use two resistance elements with two fixed resistance values, rather than the variable resistance element 7A. When the two resistance elements with different resistance values are used, one of the two resistance elements is connected between the two wires 17-11 and 17-12 and the difference in potential between the electrodes 15 and 13 of the sensor 10-1 is measured. Then, the initially mounted resistance element is replaced with the other resistance element, and the difference in potential between the electrodes 15 and 13 of the sensor 10-1 is measured again. Thus, two potential differences are obtained. The advantages similar to those of Embodiment 2 are feasible in this modification.

(b) Embodiments 1 and 2 relate to methods for measuring the side wall resistance in the contact hole pattern and the current flowing in the side walls 16*a* in the contact hole pattern, but it is possible to measure the side wall resistance and current flowing in the side wall in another pattern (for example, a line-and-space groove pattern). Also, the number of the sensors in Embodiment 1 is not limited to two.

(c) The present invention can be applied to plasma generators of various kinds such as capacitively coupled and inductively coupled generators.

(d) The structures of the sensors 10-1, 10-2 and arrangement of the wires 17-11, 17-12, 17-21 and 17-22 including the seal 5 are not limited to those shown in the drawings. Any suitable structures and arrangement may be employed depending upon given circumstances.

This application is based on Japanese Patent Application No. 2009-77150 filed on Mar. 26, 2009, and the entire disclosure thereof is incorporated herein by reference.

What is claimed is:

1. A plasma monitoring method comprising:
preparing a first sensor having two first electrodes formed in a first pattern, with a resistance element being connected between first wires respectively extending from the first electrodes;
preparing a second sensor having two second electrodes formed in a second pattern, with second wires respectively extending from the second electrodes; and
measuring in-situ a resistance of a side wall of each of the first and second patterns and/or an electric current flowing in the side wall of each of the first and second patterns during plasma processing, using said first and second sensors,
wherein the side wall of the first pattern is defined by a first contact hole, one of the two first electrodes is located at an upper end of the first contact hole and the other of the two first electrodes is located at a lower end of the first contact hole, the side wall of the second pattern is defined by a second contact hole, one of the two second electrodes is located at an upper end of the second contact hole and the other of the two second electrodes is located at a lower end of the second contact hole.

2. The plasma monitoring method according to claim 1, wherein each of said first and second contact holes has a depth that causes an electron blocking effect so that an amount of electrons accumulated on one of the two first electrodes is greater than an amount of electrons accumulated on the other of the two first electrodes, and an amount of electrons accumulated on one of the two second electrodes is greater than an amount of electrons accumulated on the other of the two second electrodes.

3. A plasma monitoring method comprising:
preparing a first sensor having two first electrodes formed in a first pattern, with a resistance element being connected between first wires respectively extending from the first electrodes;
preparing a second sensor having two second electrodes formed in a second pattern, with second wires respectively extending from the second electrodes; and
measuring in-situ a resistance of a side wall of each of the first and second patterns and/or an electric current flowing in the side wall of each of the first and second patterns during plasma processing, using said first and second sensors,
wherein a low-pass filter or a choke coil is provided on at least one of the first and second wires.

4. The plasma monitoring method according to claim 3, further comprising estimating the resistance of the side wall of the first pattern and the resistance of the side wall of the second pattern from a difference in potential between the first wires, a difference in potential between the second wires, and a resistance value of the resistance element.

5. The plasma monitoring method according to claim 3 further comprising estimating the electric current flowing in the side wall of the first pattern and the electric current flowing in the side wall of the second pattern from a difference in potential between the first wires, a difference in potential between the second wires, and a resistance value of the resistance element.

6. The plasma monitoring method according to claim 3, wherein part of one of the two first electrodes is exposed to a plasma during the plasma processing, part of the other of the two first electrodes is also exposed to the plasma during the plasma processing, part of one of the two second electrodes is exposed to the plasma during the plasma processing, part of the other of the two second electrodes is also exposed to the plasma during the plasma processing, whereby electrons and positive ions of the plasma reach said exposed parts of the first and second electrodes.

7. The plasma monitoring method according to claim 3, wherein a stage adapted to support an article to be plasma-processed is provided in the plasma chamber, and the first and second sensors are located on the stage.

8. A plasma monitoring method comprising:
preparing a sensor that is disposed in a plasma chamber and has two electrodes formed in a pattern;
preparing a resistance element that is electrically connected between the two electrodes of the sensor; and
measuring in-situ a voltage in the pattern of the sensor, using the sensor and the resistance element during plasma processing;
changing a resistance value of the resistance element; and
measuring in-situ the voltage in the pattern of the sensor during the plasma processing using the sensor and the resistance element having the changed resistance value,
wherein the pattern has at least one contact hole, one of the two electrodes is located at an upper end of the contact hole and the other of the two electrodes is located at a lower end of the contact hole.

9. The plasma monitoring method according to claim 8, further comprising estimating a resistance of a side wall in the pattern from a difference in electric potential between the two electrodes in the pattern that has been measured using a voltmeter before and after the resistance value of the resistance element is changed, and the resistance values of the resistance element before and after the resistance value of the resistance element is changed.

10. The plasma monitoring method according to claim 8, further comprising estimating an electric current flowing in a side wall of the pattern from a difference in electric potential between the two electrodes in the pattern that has been measured using a voltmeter before and after the resistance value of the resistance element is changed, and the resistance values of the resistance element before and after the resistance value of the resistance element is changed.

11. The plasma monitoring method according to claim 8, wherein part of one of the two electrodes is exposed to a plasma during the plasma processing, part of the other of the two electrodes is also exposed to the plasma during the plasma processing, whereby electrons and positive ions of the plasma reach said exposed parts of the two electrodes.

12. The plasma monitoring method according to claim 8, wherein each of said at least one contact hole has a depth that causes an electron blocking effect so that an amount of electrons accumulated on one of the two electrodes is greater than an amount of electrons accumulated on the other of the two electrodes.

13. The plasma monitoring method according to claim 8, wherein a stage adapted to support an article to be plasma-processed is provided in the plasma chamber, and the sensor is located on the stage.

\* \* \* \* \*